US006872087B2

(12) United States Patent
Sandoval et al.

(10) Patent No.: US 6,872,087 B2
(45) Date of Patent: Mar. 29, 2005

(54) METHOD AND COVER ASSEMBLY FOR PROTECTING COMPUTER SYSTEM INTERFACES

(75) Inventors: Alisa C. Sandoval, Grass Valley, CA (US); Gregory S. Meyer, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 115 days.

(21) Appl. No.: 10/206,251

(22) Filed: Jul. 26, 2002

(65) Prior Publication Data

US 2004/0017665 A1 Jan. 29, 2004

(51) Int. Cl.[7] .............................................. H01R 13/44
(52) U.S. Cl. ......................... 439/144; 439/36; 361/752
(58) Field of Search ................... 439/36, 61, 135–144; 361/752

(56) References Cited

U.S. PATENT DOCUMENTS

| | | | | |
|---|---|---|---|---|
| 5,767,999 A | * | 6/1998 | Kayner ....................... 398/164 |
| 5,879,173 A | * | 3/1999 | Poplawski et al. .......... 439/138 |
| 6,078,504 A | * | 6/2000 | Miles .......................... 361/727 |
| 6,304,436 B1 | * | 10/2001 | Branch et al. .............. 361/683 |
| 6,554,626 B2 | * | 4/2003 | Ramos, Jr. .................. 439/144 |
| 6,570,770 B1 | * | 5/2003 | Ross et al. .................. 361/752 |

* cited by examiner

Primary Examiner—Michael C. Zarroli

(57) ABSTRACT

A circuit board assembly and a method for protecting and covering an interface opening of a connector. The circuit board assembly includes a bulkhead member having a bulkhead aperture, a circuit board having a connector with an interface opening and passing through the bulkhead aperture, and a cover member disposed over the interface opening. A coupling member is provided for coupling the cover member to the connector. The method comprises passing the connector including the interface opening through the bulkhead aperture, and releasably covering the interface opening with a cover member that is coupled to the connector.

64 Claims, 7 Drawing Sheets

METHOD AND COVER ASSEMBLY FOR PROTECTING COMPUTER SYSTEM INTERFACES

BACKGROUND OF THE INVENTION

1. Field of Invention

Embodiments of the present invention broadly relate to computer systems. More specifically, embodiments of the present invention provide for a method and cover assembly for protecting a computer system interface, such as a small computer systems interface (SCSI) from an electrostatic discharge (ESD).

2. Description of the Background Art

SCSI ("scuzzy") is a data-transfer interface used to connect multiple peripheral devices, such as disk drives, tapes, or printers to computer systems while occupying only a single slot in the computer system. SCSIs are typically installed on a PC board assembly and are one of a number of available ports on the PC board for receiving various connectors where through signals (e.g., software signals) pass to and from the computer system. SCSIs should remain covered until ready for receiving the appropriate connector which is to transmit and receive signals (e.g., software signals) through the SCSI for operating the computer system.

SCSI terminators or SCSI cable ends may be employed to cover the SCSI interface of the SCSI connector, but with several disadvantages. They are expensive and are too large to pre-install on a PC circuit board prior to integrating the PC board into a computer chassis. An open SCSI interface is subject to electrostatic discharge (ESD), causing a failure in the computer systems.

SUMMARY OF EMBODIMENTS OF THE INVENTION

Embodiments of the present invention provide a method for covering an interface opening (e.g., a SCSI opening) of a connector (e.g., a SCSI connector) comprising providing a support member (e.g., a PC circuit board) including a connector having an interface opening, providing a bulkhead member having a bulkhead aperture, passing the connector through the bulkhead aperture, and releasably covering the interface opening. The bulkhead aperture may be enlarged before passing the connector through the bulkhead aperture. Alternatively, at least one bulkhead opening (e.g., a pair of bulkhead openings on opposed sides of the bulkhead aperture) may be formed in the bulkhead member prior to passing the connector through the bulkhead aperture. The bulkhead opening may be formed in the bulkhead member such that the bulkhead opening(s) may communicate with and/or overlap the bulkhead aperture.

The connector has at least one bore (e.g., a pair of bores) that is capable of being aligned with the bulkhead opening (e.g., the pair of bulkhead openings). Releasably covering the interface opening comprises disposing a cover member over the interface opening and releasably coupling the cover member to the connector. The cover member may have at least one cover aperture (e.g., a pair of apertures) that is capable of being aligned with the bulkhead opening and the bore of the connector. A coupling member (e.g., a bolt or screw member) releasably couples the cover member to the connector. The coupling member also may pass through and/or threadably connect to a retainer member (e.g., an O-ring) before passing through the bulkhead aperture or bulkhead opening of the bulkhead member and into a bore of the connector. A label may be conveniently disposed on the cover member. The label may include indicia (e.g., alphabetic indicia) for instructing a user not to touch or contact the interface opening and/or the connector. The indicia may also direct a user to a reference manual where appropriate instructions may be provided with respect on the kind of connector or coupling which is to engage the connector. A covered interface opening and/or a circuit board assembly may be produced in accordance with one or more features of the present invention.

Embodiments of the present invention also provide an assembly for protecting and covering an interface opening of a connector. The assembly includes comprising a bulkhead member having a bulkhead aperture, a support member including a connector having an interface opening and passing through the bulkhead aperture, a cover member disposed over the interface opening, and a coupling member for coupling the cover member to the connector. The coupling member may pass through the bulkhead aperture. The bulkhead member may include a structure defining a pair of opposed bulkhead openings overlapping the bulkhead aperture such that the bulkhead openings communicate with the bulkhead aperture. The connector comprises a pair of connector bores aligned with said bulkhead openings. The cover member includes a structure defining a pair of cover apertures aligned with the bulkhead openings and with the connector bores. The coupling member passes through one of the cover apertures, through one of the bulkhead openings, and into one of the connector bores. The assembly additionally comprises a retainer member engaged to the coupling member and disposed between the cover member and the bulkhead member. The connector comprises a SCSI connector, the interface opening comprises a SCSI opening, and the support member comprises a PC circuit board.

Embodiments of the present invention also provide a circuit board assembly comprising a PC circuit board, a SCSI connector coupled to the PC circuit board and having a SCSI interface, a bulkhead member having a bulkhead aperture wherethrough the SCSI connector passes, and a cover member covering the SCSI interface and coupled to the SCSI connector. The circuit board assembly may additionally comprise a coupling member passing through the cover member and through the bulkhead member and engaging the SCSI connector. An O-ring member may be engaged by the coupling member and may be disposed between the cover member and the bulkhead member. The SCSI interface includes an opening whose geometric shape is defined by a generally continuous perimetric rim where against the cover member may generally fully abut in a generally normal manner.

Embodiments of the present invention further also provide a method for transmitting computer signals through an interface of a connector comprising providing a computer circuit board including a connector having an interface opening, providing a bulkhead member having a bulkhead aperture, passing the connector through the bulkhead aperture, covering the interface opening with a cover member, removing the cover member from the interface opening, connecting a computer-signal transmitter to the interface opening, and transmitting computer signals with the computer-signal transmitter through the interface opening to the computer circuit board.

Embodiments of the present invention also provide a method for covering a SCSI opening of a SCSI connector comprising providing a circuit board including a SCSI connector having a SCSI rim with a SCSI opening; and disposing a cover member against the SCSI rim such that the cover member extends beyond the SCSI rim. The cover member is generally normal to the rim. A cover assembly produced in accordance with the method is also provided by embodiments of the invention.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

DETAILED DESCRIPTION OF EMBODIMENTS OF THE INVENTION

Figure 1:
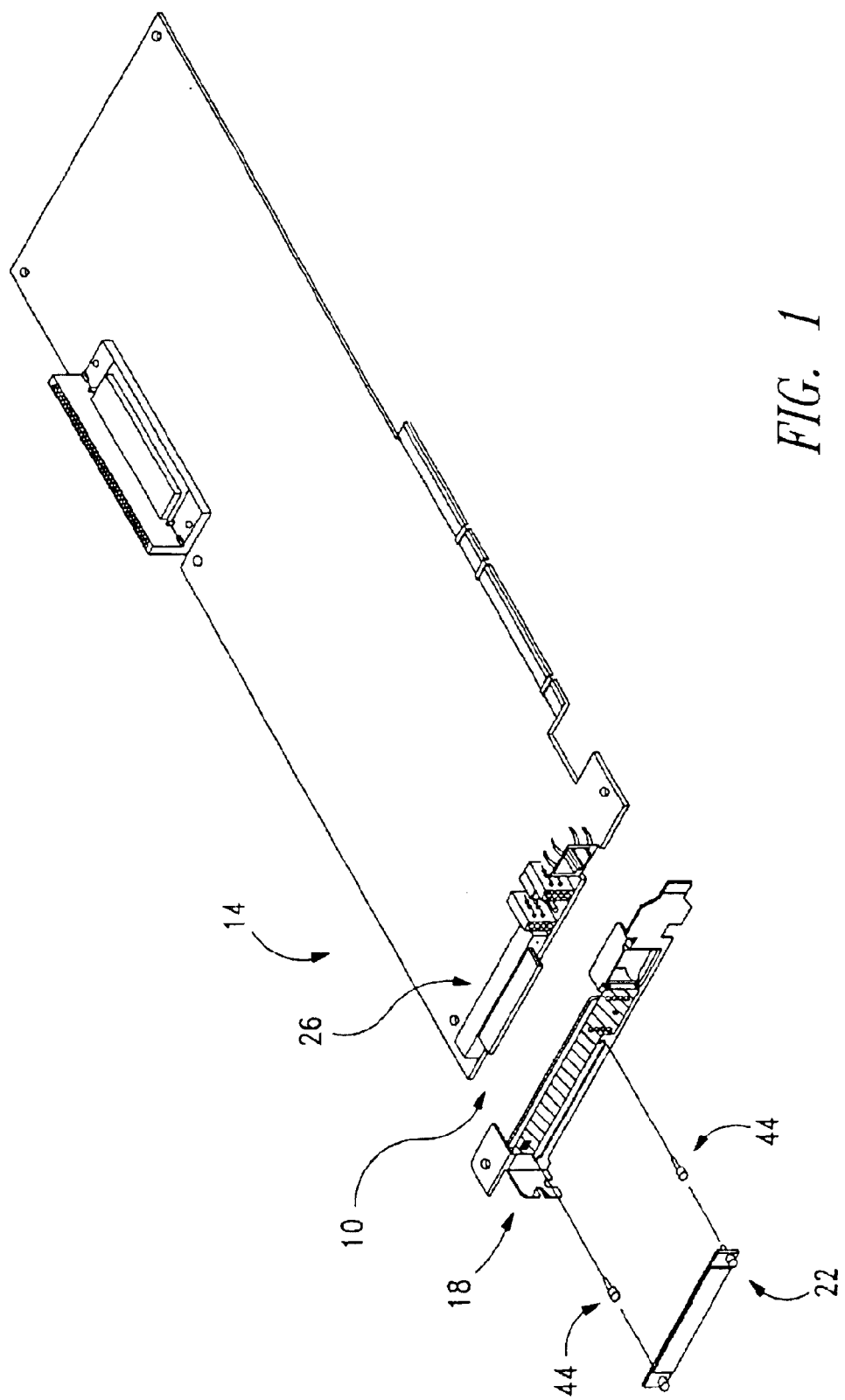
FIG. 1 is a segmented perspective view of a circuit board assembly having a SCSI connector with SCSI interface, a bulkhead member, and a cover member for releasably engaging the SCSI connector and covering the SCSI interface.

Referring in detail now to the drawings wherein similar parts of embodiments of the present invention are identified by like reference numerals, there is seen an assembly, generally illustrated as 10 in FIG. 1. The assembly 10 includes a support member 14 (e.g., a circuit board, such as a PC circuit board), a bulkhead, generally illustrated as 18, and a cover assembly, generally illustrated as 22.

Figures 2A, 2B:
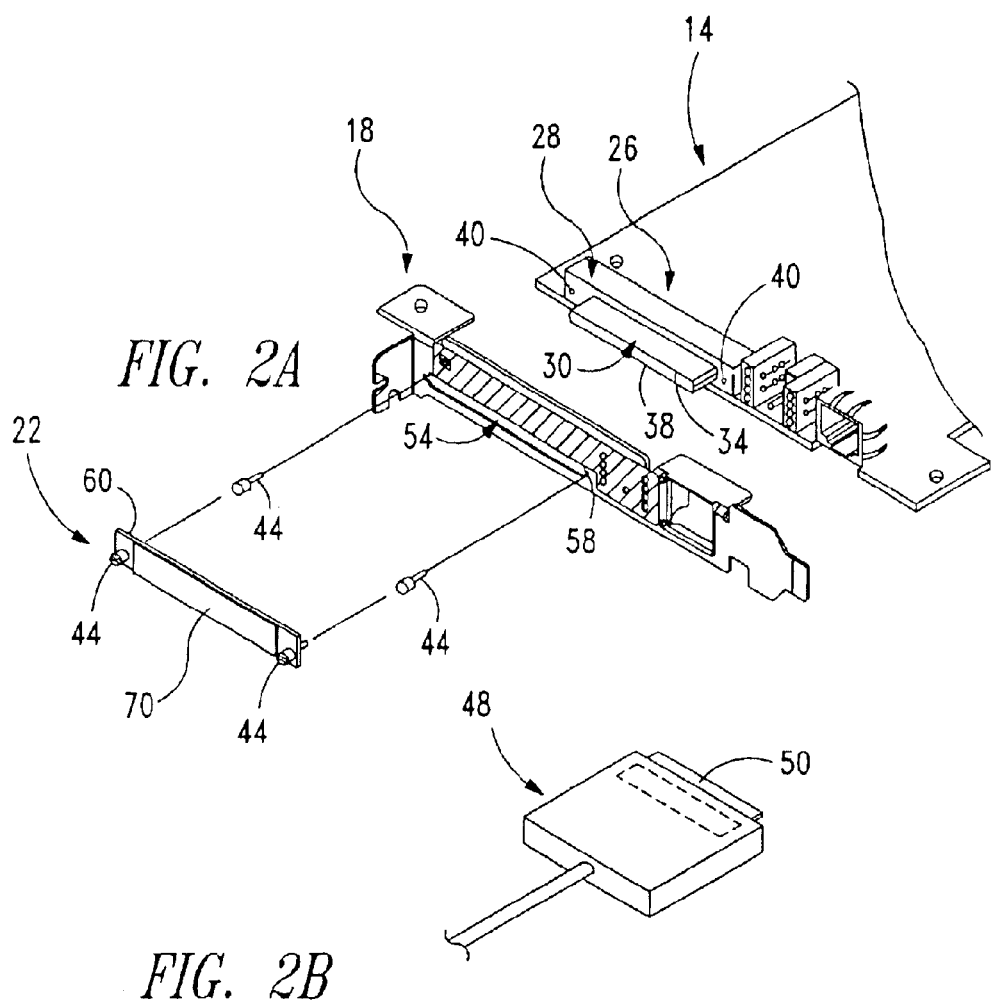
FIG. 2A is a partial enlarged segmented perspective view of the circuit board assembly of FIG. 1.
FIG. 2B is a partial perspective view of a connector head of a computer-signal transmitter/receiver for engaging the SCSI interface of the SCSI connector after removal of the cover member.
Figure 10:
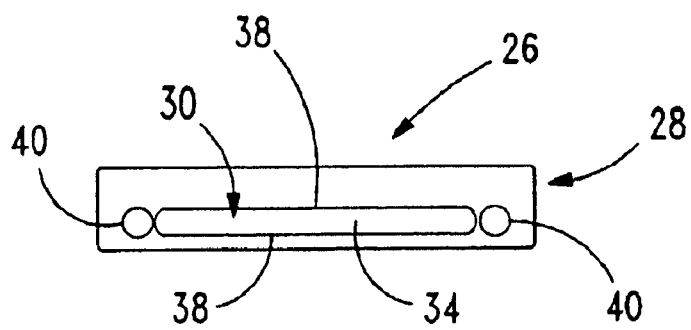
FIG. 10 is a front elevational view of the SCSI connector illustrating the SCSI interface opening and a pair of SCSI connector bores for receiving the retainer members (e.g., jack screws).

The support member 14 has a connector assembly, generally illustrated as 26. Connector assembly 26 may be any suitable connector 28, such as by way of example only, one having a computer system interface 30, more particularly a SCSI connector having a SCSI interface. The computer system interface 30 has an opening 34 whose geometric shape and size is defined by a generally continuous rim 38 that forms a perimeter around opening 34. The opening 34 may have any suitable size or shape, such as square, rectangular, circular, oval, or elliptic al as best shown in FIG. 10. The connector 28 also has one or more bores 40 for removably receiving one or more coupling members, each identified as 44 in the drawings. As further described below, the coupling member(s) 44 releasably secure(s) the cover member 22 to the connector assembly 26, more specifically to the connector 28. The connector assembly 26 may engage any suitable connector or device, such as connector 48 in FIG. 2B, which includes a tongue 50 for passing through opening 34 to contact computer system interface 30 in order to transmit and receive software signals.

Figure 9:
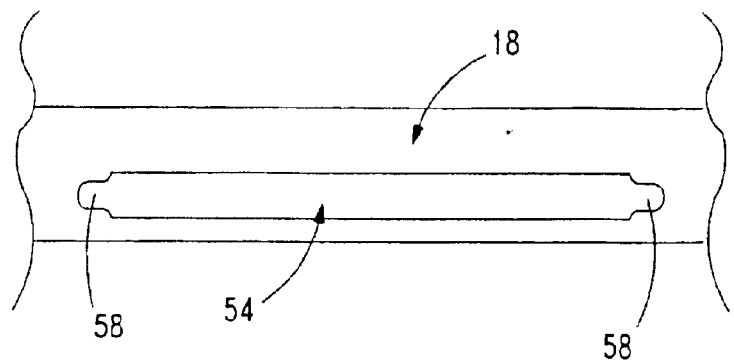
FIG. 9 is a partial enlarged side elevational view of the bulkhead aperture after forming the bulkhead openings which overlap with and enlarge the bulkhead aperture.

The bulkhead 18 has a bulkhead aperture 54 which may be of any size or shape, such as a size and shape for comfortably slidably receiving the rim 38 that forms the extremities and boundaries for opening 34. In an embodiment of the present invention bulkhead aperture 54 may be of existing sufficient size and shape to accommodate the coupling member(s) 44 as well as the rim 38 of the connector 28. Alternatively, one or more bulkhead opening(s) 58 may be subsequently suitably formed (e.g., by drilling, tapping, etc.) in the bulkhead 18, either distantly from the bulkhead aperture 54 or overlapping with as best shown in FIG. 9 such that the bulkhead aperture 54 is enlarged by the size and shape of the bulkhead opening 58. The bulkhead opening 58 may be aligned with the bore(s) 40 such that the coupling members 44—44 may conveniently pass through the bulkhead openings 58—58 and into the bores 40—40 of the connector 28.

Figure 6A:
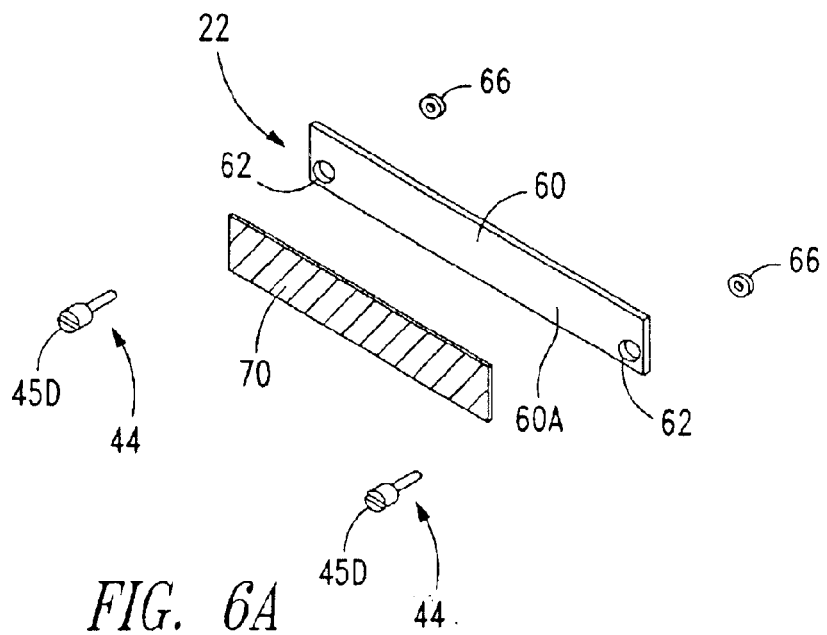
FIG. 6A is a segmented perspective view of the cover assembly, illustrating the coupling members, the label, the cover member having cover apertures, and retainer members (e.g., O-rings).
Figure 6B:
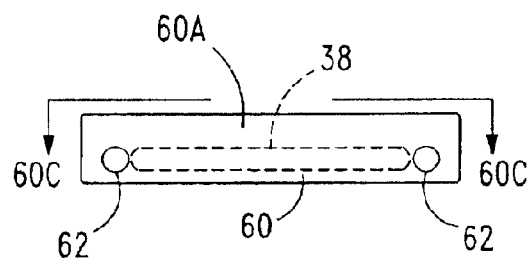
FIG. 6B is a front elevational view of the cover member abutting in a normal relationship the rim defining the boundaries of the interface opening, with the rim being represented as dashed lines.
Figure 6C:
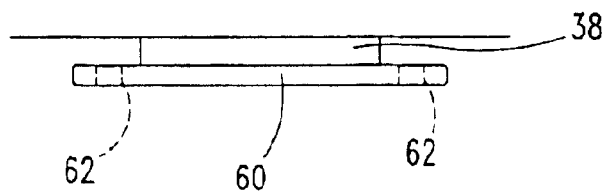
FIG. 6C is a top plan views taken in direction of the arrows and along the plane of line 6C—6C in FIG. 6B.
Figure 7:
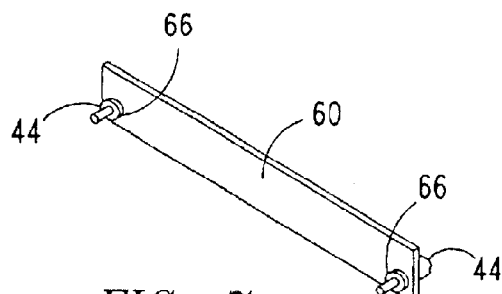
FIG. 7 is a perspective view of the cover assembly of FIG. 6 after assembling and interconnecting the associated components.
Figure 8:
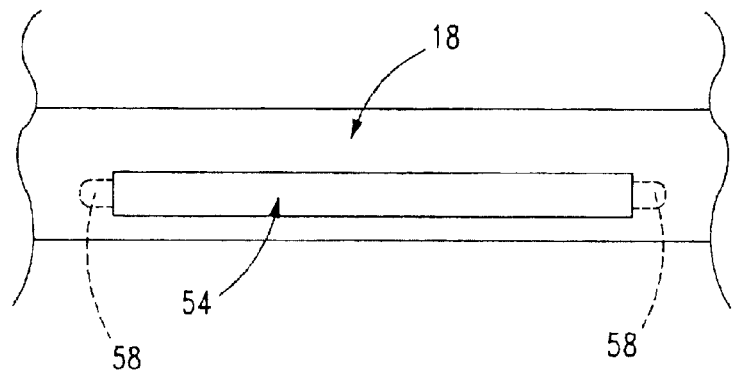
FIG. 8 is a partial enlarged side elevational view of the bulkhead aperture with the dashed lines representing the location of where bulkhead openings are to be formed for enlarging the bulkhead aperture and for providing bulkhead-opening loci for the bulkhead openings which align with the cover apertures of the cover member.

The cover assembly 22 includes a cover member 60 having one or more cover aperture(s) 62, as shown in FIG. 6A. Cover aperture(s) 62 aligns with bulkhead opening(s) 58, which as indicated, aligns with the bore(s) 40 in the connector 26 of the connector assembly 26. Such alignment facilitates the passage of the coupling members 44—44 through cover apertures 62—62, through bulkhead openings 58—58, and into the bore(s) for engaging the cover member 60 against the rim 38 of and to the connector 26. When the cover member 60 is engaged as such, the rim 38 abuts and is flushed against the rim 38 to protect the computer system interface 34 until ready for connecting with the connector 48 for transmission and reception of software signals to and from the PC circuit board assembly 14. When the cover member 60 is also further engaged as such, the cover member 60 is generally normal or perpendicular to the rim 38 and extends beyond, or flanges outwardly or away from, the perimetric rim 38, all as best shown in FIGS. 6B and 6C.

Thus, opening 34 is totally sealed and protected from any outside external force.

The cover assembly 22 also includes one or more retainer member(s) 66 which may be threaded (e.g., threaded internally) for engaging coupling members 44 when the latter has an externally threaded structure as shown in FIG. 6A. The retainer member(s) is disposed between the cover member 60 and bulkhead 18 and functions to retain the coupling member 44 in the cover aperture 62 after being disengaged from the bore(s) 40 of the connector 28 and withdrawn out of bulkhead opening(s) 58 of the bulkhead 18. Typically, the coupling members 44 are of mini or minute size, thus without the retainer member(s) 66 they could easily fall out of the cover apertures 62 and be lost or difficult to find after disengaging them from the bore(s) 40 of the connector 28. The retainer members 66 may have any suitable retaining structure, such as an O-ring. The cover assembly 22 may also have a label 70 stuck to a facial surface 60a of the cover member 60. The label 70 would typically have indicia 74, such as alphabetic indicia 74a representing a page of a reference manual which contain directions and instructions to a user not to touch or contact the computer system interface 34 in the opening 30 of the connector assembly 26.

Figure 11:
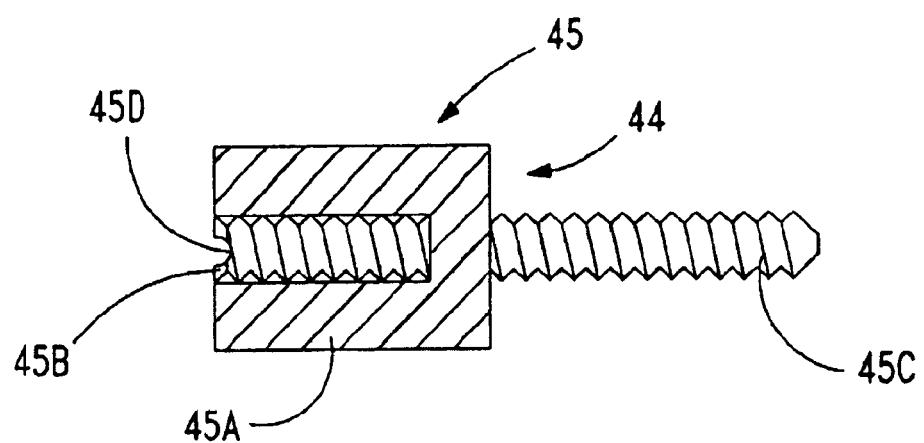
FIG. 11 is an enlarged vertical sectional view of one embodiment of a retainer member for engaging one of the SCSI connector bores to releasably couple the cover member to the SCSI connector.

The coupling member 44 may be any suitable member that is capable of coupling the cover member 60 to the connector assembly 26. By way of example only and as illustrated in FIG. 11, coupling member 44 may comprise a jack screw, generally illustrated as 45, defined by a screw body 45a having a female opening 45b and a male member 45c engaged to the screw body 45a. As further illustrated in FIG. 11, the female opening 45b and/or the male member 45c may be threaded for receiving or engaging a corresponding threaded structure (e.g., the male member 45c engaging bore(s) 40 of the connector 28). The coupling member 44, such as the jack screw 45, may be formed with a slot 45d for receiving the flat blade of a screwdriver (not shown) for tightening the coupling member 44 to an extent that it can not be removed by hand. By having to remove the coupling member 44 through the use of a tool, such as a screwdriver, the assembler or user would inherently be reminded not to inadvertently engage the SCSI connector 28 with a peripheral device prior to the computer system's firmware preparedness. Such prematurely connecting of a peripheral device could cause data loss.

Figure 3:
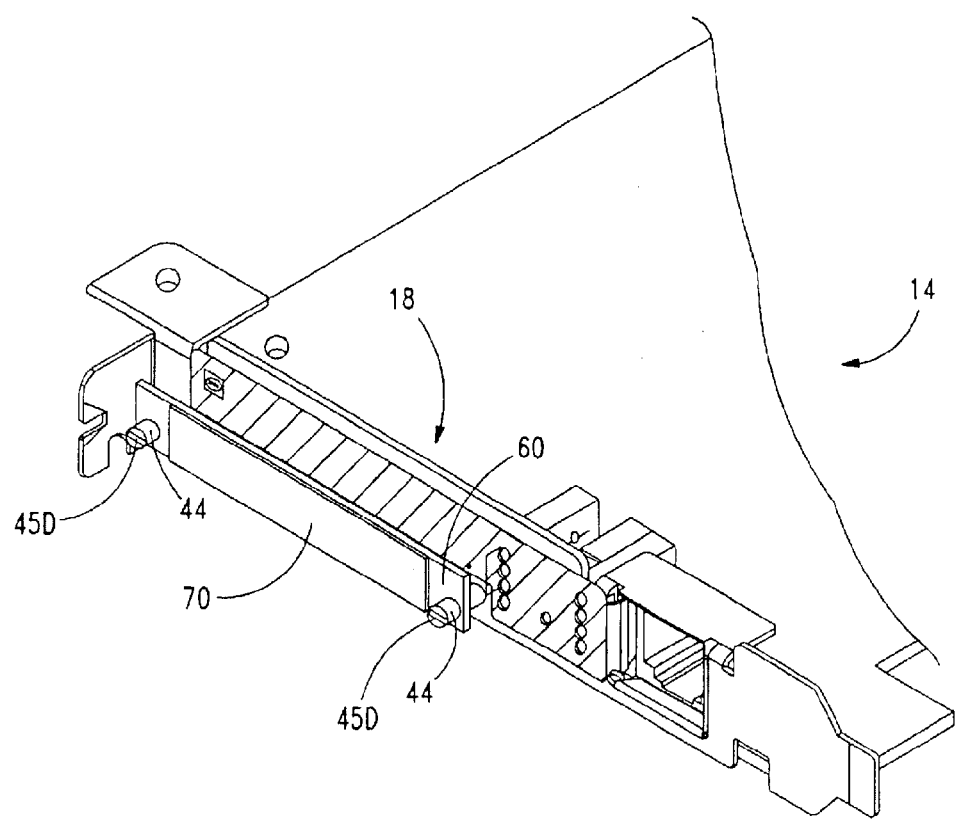
FIG. 3 is a partial enlarged perspective view of the cover member disposed over the SCSI interface of the SCSI connector and releasably engaged to the SCSI connector by coupling members (e.g., jack screws).
Figure 4:
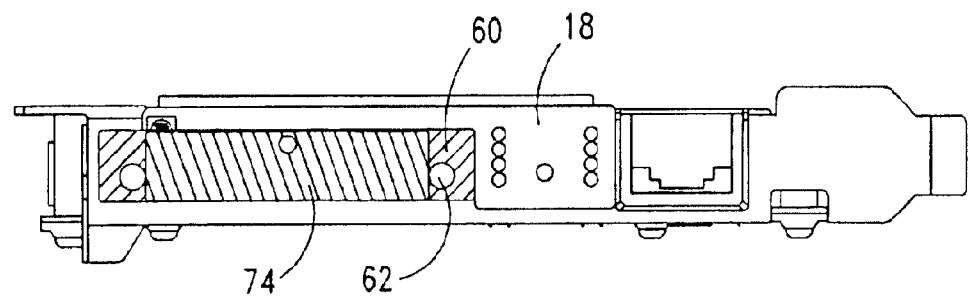
FIG. 4 is a front elevational view of the cover member disposed over the SCSI interface of the SCSI connector and releasably engaged to the SCSI connector by coupling members.

Continuing to refer to the drawings for operation of embodiments of the invention, including a method for covering an interface opening of a connector, a suitable circuit board, such as circuit board 14, is provided. As indicated, the circuit board 14 includes a SCSI connector 28 having a SCSI interface 30. As further indicated, the SCSI interface 30 has the SCSI opening 34 whose boundaries are defined by the generally continuous rim 38. The SCSI opening 34 is covered by or with the cover member 60 such that the cover member 60 extends beyond the rim 38. By such extension, the cover member 60 would be generally perpendicular to the structure defining the rim 38. In another embodiment of the invention, the connector 28 would be passed through the bulkhead aperture 54 before the cover member 60 is disposed against the rim 38. Subsequently, the cover member 60 is disposed or flushed against the rim 38 such that the cover apertures 62—62 are aligned with bulkhead openings 58—58 which are also aligned with SCSI bores 40—40. The coupling members 44—44 are then passed through the cover apertures 62—62, through the bulkhead openings 58—58, and into the SCSI bores 40—40 of the SCSI connector 28. In another embodiment of the invention, coupling members 44—44 pass through retainer members 66—66 after positioning the retainer members 66—66 between the cover member 60 and bulkhead 18. The coupling members 44—44 are then tightened through the use of any suitable tool. When the coupling members 44—44 are formed with slots 45d—45d, a flat blade screwdriver may be used for tightening. After the coupling members 44—44 have been suitably engaged within SCSI bores 40—40, the assembly of FIG. 3 is produced for shipping to a desired user or assembler.

Figure 5:
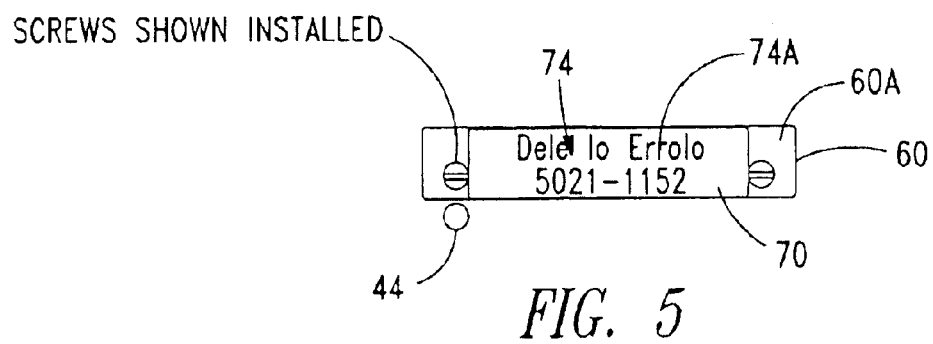
FIG. 5 is a front elevational view of the cover member with the coupling members installed and having a label containing directions for a user not to engage the SCSI interface with an electrical power supply after removal of the cover member.

When a user or assembler is ready for removing the cover member 60, a tool would be required since coupling members 44—44 were tightened by a suitable tool. As previously indicated, by having to remove the coupling members 44—44 through the use of a tool, such as a screwdriver, the assembler or user would be dissuaded from connecting a peripheral device to the SCSI interface 34 prior to the computer system's firmware preparedness, which would cause a loss of data of the computer system. Alternatively, because the cover member 60 would be supporting a suitable label 70 with indicia 74 (e.g., see FIG. 5), the indicia 74 on the cover member 60 could direct the user or assembler to an appropriate page of an assembling manual for instructions not to touch or contact the SCSI interface 34. Thus a supplemental benefit of cover assembly is to protect the internal electronics from electrostatic discharge (ESD). Such voltages generated in this manner can be in the tens of thousands of volts, and may easily cause permanent damage to sensitive components on the printed circuit assemblies. After the coupling members 44—44 have been disengaged from the bores 40—40 of the connector 28 and withdrawn out of bulkhead openings 58—58 of the bulkhead 18, the retainer members 66—66 function to keep the coupling members 44—44 in the cover apertures 62—62. After the cover member 60 has been removed, the SCSI interface 34 is exposed for receiving an appropriate computer-signal transmitter, such as the connector head of FIG. 2B.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for covering an interface opening of a connector comprising:

provided a support member including a connector having an interface opening;

providing a bulkhead member having a bulkhead aperture;

passing the connector through the bulkhead aperture; and releasably covering the interface opening with a cover member, including passing at least one coupling member through the cover member, through the bulkhead member, and through the connector.

2. The method of claim 1 wherein the bulkhead aperture is enlarged by a bulkhead opening.

3. The method of claim 1 additionally comprising forming at least one bulkhead opening in the bulkhead, member prior to passing the connector through the bulkhead aperture.

4. The method of claim 3 wherein said bulkhead opening communicates with the bulkhead aperture.

5. The method of claim 1 additionally comprising forming a pair of bulkhead openings in the bulkhead member prior to passing the connector through the bulkhead aperture.

6. The method of claim 5 wherein said bulkhead aperture is disposed between said pair of bulkhead openings.

7. The method of claim 5 wherein said bulkhead aperture is disposed between said pair of bulkhead openings and overlaps said bulkhead openings such that the bulkhead aperture is enlarged by the size of the pair of bulkhead openings.

8. The method of claim 3 additionally comprising aligning a bore of the connector with the bulkhead opening in the bulkhead member.

9. The method of claim 1 wherein said releasably covering the interface opening comprises disposing the cover member over the interface opening and releasably coupling the cover member to the connector.

10. The method of claim 8 wherein said releasably covering the interface opening comprises disposing over the interface opening the cover member, wherein the cover member includes at least one cover aperture that is capable of being aligned with the bulkhead opening, and releasably coupling the cover member to the connector.

11. The method of claim 10 wherein said releasably coupling of the cover member to the connector comprises passing a coupling member through the cover aperture, through the bulkhead opening, and into the bore of the connector.

12. The method of claim 11 wherein said coupling member comprises a male member.

13. The method of claim 11 additionally comprising passing the coupling member through a retainer member before passing the coupling member through the bulkhead opening.

14. The method of 12 additionally comprising passing the male member of the coupling member through an O-ring before passing the male member through the bulkhead opening.

15. The method of claim 14 wherein said male member has a structure defining a threaded shaft and said O-ring comprises internal threads for threadably engaging the threaded shaft of the male member.

16. The method of claim 1 wherein said connector comprises a SCSI connector.

17. The method of claim 15 wherein said connector comprises a SCSI connector.

18. The method of claim 1 additionally comprising placing a label on said cover member, said label comprising indicia for instructing a user not to touch the interface opening of the connector.

19. A covered interface opening produced in accordance with the method of claim 1.

20. A method for covering an opening of a SCSI connector comprising:

providing a circuit board including a SCSI connector having an opening;

providing a bulkhead member having a bulkhead aperture;

passing the SCSI connector through the bulkhead aperture; and releasably covering the opening with a cover member, including passing at least one coupling member through the cover member, through the bulkhead member, and through the SCSI connector.

21. The method of claim 20 wherein the bulkhead aperture is enlarged by a bulkhead opening.

22. The method of claim 20 additionally comprising forming at least one bulkhead opening in the bulkhead member prior to passing the SCSI connector through the bulkhead aperture.

23. The method of claim 22 wherein said bulkhead opening overlaps the bulkhead aperture such that the bulkhead opening and the bulkhead aperture are in communication.

24. The method of claim 20 wherein said releasably covering the opening comprises disposing over the opening the cover member, wherein the cover member includes at least one cover aperture, aligning the cover aperture with the bulkhead opening, and passing a coupling member through the cover aperture, through the bulkhead opening and into a bore of the SCSI connector.

25. The method of claim 23 wherein said releasably covering the opening comprises disposing over the opening the cover member, wherein the cover member includes at least one cover aperture, aligning the cover aperture with the bulkhead opening, and passing a coupling member through the cover aperture, through the bulkhead opening and into a bore of the SCSI connector.

26. The method of claim 24 additionally comprising passing the coupling member through a retainer member before passing the coupling member through the bulkhead opening.

27. The method of claim 25 additionally comprising passing the coupling member through a retainer member before passing the coupling member through the bulkhead opening.

28. A covered SCSI connector produced in accordance with the method of claim 20.

29. An assembly for protecting and covering an interface opening of a connector, the assembly comprising:

a bulkhead member having a bulkhead aperture;

a support member including the connector having the interface opening and passing through the bulkhead aperture;

a cover member disposed over said interface opening; and a coupling member for coupling the cover member to the connector, wherein the coupling member passes through the cover member, through the bulkhead member, and through the connector.

30. The assembly of claim 29 wherein said coupling member passes through said bulkhead aperture.

31. The assembly of claim 29 wherein said bulkhead member has a structure defining a pair of opposed bulkhead openings overlapping said bulkhead aperture such that said bulkhead openings communicate with said bulkhead aperture.

32. The assembly of claim 31 wherein said connector comprises a pair of connector bores aligned with said bulkhead openings.

33. The assembly of claim 32 wherein said cover member includes a structure defining a pair of cover apertures aligned with said bulkhead openings and with said connector bores.

34. The assembly of claim 33 wherein said coupling member passes through one of the cover apertures, through one of the bulkhead openings, and into one of the connector bores.

35. The assembly of claim 34 additionally comprising a retainer member engaged to said coupling member and disposed between said cover member and said bulkhead member.

36. The assembly of claim 35 wherein said connector comprises a SCSI connector, and said support member comprises a circuit board.

37. A circuit board assembly comprising a circuit board; a SCSI connector coupled to the circuit board and having a SCSI interface; a bulkhead member having a bulkhead aperture wherethrough said SCSI connector passes; and a cover member covering said SCSI interface, and a coupling member passing through the cover member, through the bulkhead member, and through the SCSI connector.

38. The circuit board assembly of claim 37, wherein the coupling member passes through said cover member and through said bulkhead member and engages said SCSI connector.

39. The circuit board assembly of claim 38 additionally comprising an O-ring member engaged by said coupling member and disposed between said cover member and said bulkhead member.

40. The circuit board assembly of claim 39 wherein said SCSI interface includes an opening whose geometric shape is defined by a generally continuous perimetric rim.

41. The circuit board assembly of claim 40 wherein said cover member generally fully abuts the perimetric rim in a generally normal manner.

42. A method for transmitting computer signals through an interface of a connector comprising:
    providing a computer circuit board including a connector having an interface opening;
    providing a bulkhead member having a bulkhead aperture;
    passing the connector through the bulkhead aperture;
    covering the interface opening with a cover member;
    removing the cover member from the interface opening;
    connecting a computer-signal transmitter to the interface opening; and
    transmitting computer signals with the computer-signal transmitter through the interface opening to the computer circuit board.

43. A method for covering an opening of a SCSI connector comprising:
    providing a circuit board including a SCSI connector having a rim with an opening; and
    disposing a cover member against the rim such that the cover member extends beyond the rim, wherein said cover member is generally normal to said rim.

44. A covered SCSI connector produced in accordance with the method of claim 43.

45. A method for covering an interface opening of a connector comprising:
    providing a support member including a connector having an interface opening;
    providing a bulkhead member having a bulkhead aperture;
    forming at least one bulkhead opening in the bulkhead member;
    passing the connector through the bulkhead aperture; and
    releasably covering the interface opening.

46. The method of claim 45 wherein said bulkhead opening communicates with the bulkhead aperture.

47. The method of claim 45 additionally comprising aligning a bore of the connector with the bulkhead opening in the bulkhead member.

48. The method of claim 45 wherein said releasably covering the interface opening comprises disposing a cover member over the interface opening and releasably coupling the cover member to the connector.

49. The method of claim 47 wherein said releasably covering the interface opening comprises disposing over the interface opening a cover member, wherein the cover member includes at least one cover aperture that is capable of being aligned with the bulkhead opening, and releasably coupling the cover member to the connector.

50. The method of claim 49 wherein said releasably coupling of the cover member to the connector comprises passing a coupling member through the cover aperture, through the bulkhead opening, and into the bore of the connector.

51. The method of claim 50 additionally comprising passing the coupling member through a retainer member before passing the coupling member through the bulkhead opening.

52. The method of claim 45 wherein said connector comprises a SCSI connector.

53. A covered interface opening produced in accordance with the method of claim 45.

54. A circuit board assembly comprising a circuit board; a SCSI connector coupled to the circuit board and having a SCSI interface; a bulkhead member having a bulkhead aperture wherethrough said SCSI connector passes; a cover member covering said SCSI interface; and a coupling member that passes through said cover member and through said bulkhead member and engages said SCSI connector.

55. The circuit board assembly of claim 54 additionally comprising an O-ring member engaged by said coupling member and disposed between said cover member and said bulkhead member.

56. The circuit board assembly of claim 55 wherein said SCSI interface includes an opening whose geometric shape is defined by a generally continuous perimetric rim.

57. The circuit board assembly of claim 56 wherein said cover member generally fully abuts the perimetric rim in a generally normal manner.

58. An assembly for protecting and covering an interface opening of a connector, the assembly comprising:
    a bulkhead member having a bulkhead aperture;
    a support member including the connector having the interface opening and passing through the bulkhead aperture;
    a cover member disposed over said interface opening; and
    a coupling member for coupling the cover member to the connector, wherein said coupling member passes through said bulkhead aperture.

59. The assembly of claim 58 wherein said bulkhead member has a structure defining a pair of opposed bulkhead openings overlapping said bulkhead aperture such that said bulkhead openings communicate with said bulkhead aperture.

60. The assembly of claim 59 wherein said connector comprises a pair of connector bores aligned with said bulkhead openings.

61. The assembly of claim 60 wherein said cover member includes a structure defining a pair of cover apertures aligned with said bulkhead openings and with said connector bores.

62. The assembly of claim 61 wherein said coupling member passes through one of the cover apertures, through one of the bulkhead openings, and into one of the connector bores.

63. The assembly of claim 62 additionally comprising a retainer member engaged to said coupling member and disposed between said cover member and said bulkhead member.

64. The assembly of claim 63 wherein said connector comprises a SCSI connector, and said support member comprises a circuit board.

* * * * *